United States Patent
Sharifi Tehrani (10) Patent No.: US 10,241,851 B2
(45) Date of Patent: Mar. 26, 2019

(54) ESTIMATION OF ERROR CORRECTING PERFORMANCE OF LOW-DENSITY PARITY-CHECK (LDPC) CODES

(71) Applicant: Micron Technology, Inc., Boise, ID (US)

(72) Inventor: Saeed Sharifi Tehrani, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 216 days.

(21) Appl. No.: 14/992,657

(22) Filed: Jan. 11, 2016

(65) Prior Publication Data

US 2017/0199775 A1    Jul. 13, 2017

(51) Int. Cl.
| G06F 11/07 | (2006.01) |
| H03M 13/00 | (2006.01) |
| H03M 13/11 | (2006.01) |
| H03M 13/15 | (2006.01) |

(52) U.S. Cl.
CPC ........ G06F 11/076 (2013.01); G06F 11/0727 (2013.01); H03M 13/1105 (2013.01)

(58) Field of Classification Search
CPC .............. G06F 11/076; G06F 11/0727; H03M 13/1105; H03M 13/151
See application file for complete search history.

(56) References Cited

U.S. PATENT DOCUMENTS

| 4,165,444 A * | 8/1979 | Gordon ................. H04L 9/0662 380/265 |
| 5,712,861 A * | 1/1998 | Inoue .................. H03M 13/151 714/752 |
| 7,231,577 B2 * | 6/2007 | Richardson ........... H03M 13/00 714/748 |
| 8,151,162 B2 * | 4/2012 | Kanaoka ............ G11B 20/1833 714/755 |
| 8,499,218 B2 * | 7/2013 | Yedidia ............... H03M 13/036 714/752 |
| 2015/0301985 A1 * | 10/2015 | Zhang ................. H03M 13/158 708/403 |

* cited by examiner

*Primary Examiner* — Phung M Chung
(74) *Attorney, Agent, or Firm* — Schwegman Lundberg & Woessner, P.A.

(57) ABSTRACT

Some embodiments include apparatuses and methods using a low-density parity-check (LDPC) decoding circuit to receive information retrieved from memory cells, the information including codewords, and a calculating circuit to calculate a rate of codeword errors in the codewords. The calculation is based on a rate of erroneous bits in the information and a rate of erroneous bits with a selected reliability level. The erroneous bits with the selected reliability level form a portion of the erroneous bits in the information.

19 Claims, 7 Drawing Sheets

ESTIMATION OF ERROR CORRECTING PERFORMANCE OF LOW-DENSITY PARITY-CHECK (LDPC) CODES

BACKGROUND

Memory devices are widely used to store information in computers, cellular phones, and other electronic devices or systems. Some memory devices have an error correction engine to correct certain types of errors that may occur in the information. Some of these memory devices may also have techniques to measure the performance of the error correction engine. Based on the performance measurements, the memory device may perform certain operations in order to maintain the reliability of the information stored in the memory device. For some memory devices, incorporating techniques to achieve a relatively high accuracy of performance measurement of the error correction engine may be complex, impractical, or both.

BRIEF DESCRIPTION OF THE DRAWINGS

FIG. 5A through FIG. 5D are block diagrams of circuits for calculating the value for a rate of codeword errors, according to some embodiments described herein.

DETAILED DESCRIPTION

The embodiments described herein include a memory device (described herein in the form of a flash-based solid state drive) having memory cells to store information. The memory device includes an error correction engine to correct errors that may occur in information retrieved from the memory cells. The information includes bits. Each of the bits has a binary value (e.g., binary 0 or binary 1). The errors in the information occur when the information has a single erroneous bit or multiple erroneous bits. An erroneous bit is the bit having a value that is different from its expected value (e.g., original value).

The error correction engine of the memory device described herein can be configured to use LDPC codes for its error correction operations. The LDPC codes can be binary LDPC codes, non-binary LDPC codes, or other classes of LDPC codes. The error correction engine can include an LDPC encoder to encode data (e.g., user data) using LDPC codes and generate information (e.g., LDPC encoded codewords) to be stored in memory cells of the memory device. The error correction engine can include an LDPC decoder which receives the stored information retrieved from the memory cells as input (e.g., during read operation) and decode information and provides decoded information (e.g., LDPC output codewords).

The memory device can be configured to provide an evaluation of the performance of the LDPC codes used in the error correction engine. The evaluation can be performed by the error correction engine or by another unit in the memory device. Evaluation of the LDPC codes provides useful information to improve performance of the memory device. For example, based on the evaluation, the memory device can perform memory management operations in order to maintain the reliability of the information stored in the memory cells of the memory device.

Unlike algebraic codes (e.g., the conventional Bose-Chaudhuri-Hocquenghem (BCH) codes), evaluation of the performance of LDPC codes usually involves extensive simulation (e.g., Monte Carlo simulation) because of the pseudo-random structure and the high sensitivity of LDPC codes. For example, error correcting performance of LDPC codes may be highly sensitive to not only to the rate of erroneous bits (RBER) presented to an LDPC decoder but also the "quality of soft information". The quality of soft information in the memory device can be measured by High Reliability Error Rate (HRER). HRER is the rate of the erroneous bits that have high reliability value (e.g. high absolute magnitude log-likelihood ratios (LLRs)).

The techniques described herein use both information RBER and HRER to efficiently and accurately estimate the performance of the LDPC codes. An example technique described herein formulates a look-up table (LUT) using a few low-complexity polynomials. The LUT reports a codeword error rate (CWER) of LDPC output codewords in information retrieved from memory cells of the memory device. Based on the formulated polynomials, the value for a codeword error rate (CWER) can be calculated without using the LUT.

Some conventional techniques may rely only on information RBER as a metric to initiate certain memory management operations. Using both information RBER and HRER based on techniques described herein, improved accuracy of the estimation of the codeword error rate (CWER) may be achieved. This may lead to an increase in the efficiency in management of the memory device, such as reducing the number operations (e.g., memory management operations) of moving stored information from one location to another location of the memory device (e.g., reducing write amplifications in the memory device), for example.

Figure 1:
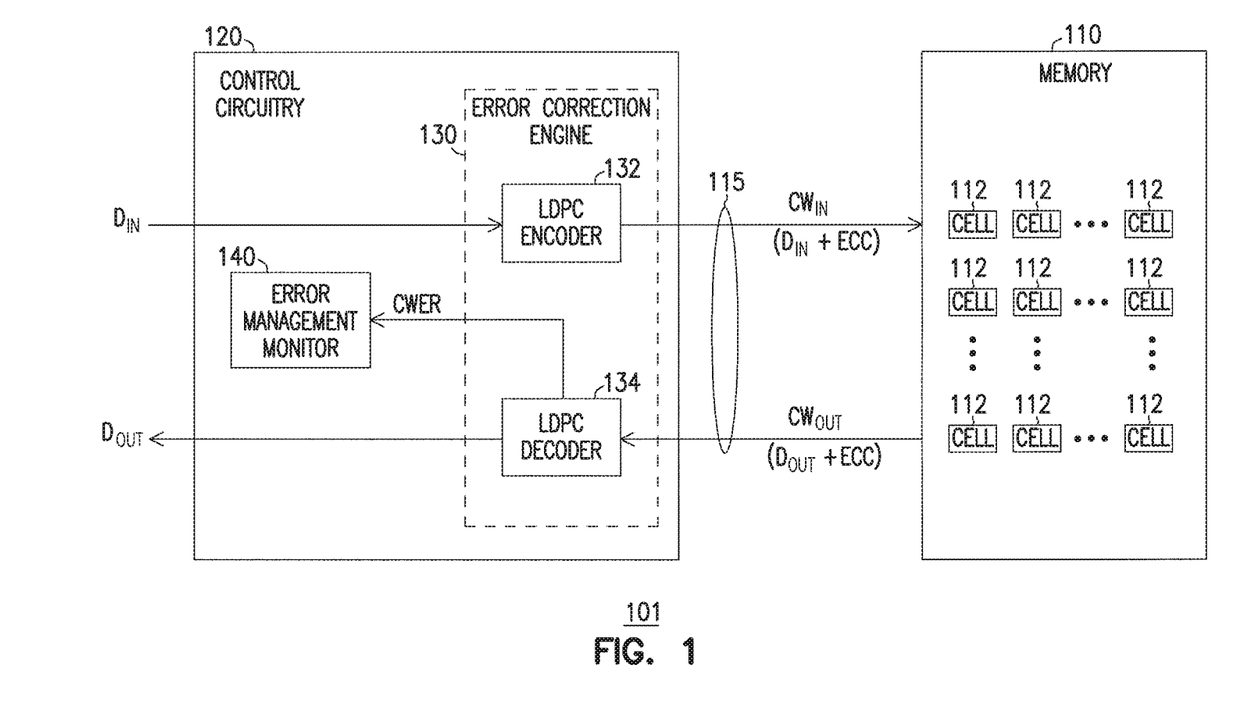
FIG. 1 is a block diagram of an apparatus in the form of memory device including an error correction engine, according to some embodiments described herein.

FIG. 1 is a block diagram of an apparatus in the form of memory device 101 including an error correction engine 130, according to some embodiments described herein. Memory device 101 can include a memory 110 (e.g., a memory array or multiple memory arrays) including memory cells 112 to store information. Memory 110 can include a single die or multiple dice. Memory cells 112 can include non-volatile (e.g., flash) memory cells. Memory cells 112 can be arranged in a NAND-type (e.g., NAND flash) memory arrangement or other types of memory arrangement. The novel methods and processes are described in the context of a NAND flash device for purposes of the present description, though they can be used with any other type of memory or memory cells. For example, memory cells 112 can be phase change memory cells, ferroelectric random-access memory (FeRAM) cells, magnetoresistive random-access memory (MRAM) cells, resistive random-access memory (RRAM) cells, spin-transfer torque memory cells, or other types of non-volatile memory cells.

As shown in FIG. 1, memory device 101 can include control circuitry 120 to control operations in memory device 101. Control circuitry 120 be included in (e.g., formed in or formed on) a die, which can be the same as or different from the die (or dice) where memory cells 112 are included. Control circuitry 120 and memory 110 can communicate (e.g., exchange information in the form of signals) with each other through a connection 115. Examples of connection 115 includes conductive paths on a die, traces (e.g., metal traces) on a circuit board, or other types of connections.

Memory device 101 can include a write operation to store (e.g., write) information $CW_{IN}$ (e.g., input information) in memory cells 112. Memory device 101 can include a read operation to retrieve (e.g., read) information CWouT (e.g., output information) from memory cells 112.

Error correction engine 130 can include an LDPC encoder 132 and an LDPC decoder 134. During a write operation, LDPC encoder 132 can operate to encode data $D_{IN}$ (e.g., input data) with an error correction code (ECC) based on LDPC codes to generate information $CW_{IN}$. Data $D_{IN}$ can include data bits (e.g., original input data bits). The ECC part in information $CW_{IN}$ can include ECC bits (e.g., parity bits added by LDPC encoder) associated with the data bits of data $D_{IN}$. Data $D_{IN}$ can include user data provided to memory device 101 by another device (e.g., a host (e.g., central processing unit (CPU) or a memory controller.

During a read operation, LDPC decoder 134 can operate to decode information $CW_{OUT}$ retrieved from memory cells 112 and generate data $D_{OUT}$ (e.g., output data). Data $D_{OUT}$ can be provided to another device (e.g., a host (e.g., central processing unit (CPU) or a memory controller for further processing. As shown in FIG. 1, information $CW_{OUT}$ can include data $D_{OUT}$ and associated ECC bits. Data $D_{OUT}$ can include data bits (e.g., output data bits). The ECC part in information $CW_{OUT}$ can include ECC bits (e.g., retrieved parity bits from memory) associated the data bits of $D_{OUT}$.

Data $D_{IN}$ provided to LDPC encoder 132 can include data bits that can be organized into units (e.g., pages) of data bits. Each unit (e.g., each page) among the units of data bits includes a number of data bits. As an example, each of the units of data bits of data $D_{IN}$ can include 4,096 (e.g., 4K) data bits, 8,192 (e.g., 8K) data bits, or another number of bits.

Information $CW_{IN}$ can be organized into input codewords. Each of the input codewords can include a combination of data bits from a particular unit (e.g., a page) of data bits (included in data $D_{IN}$) and ECC bits (generated by LDPC encoder 132) associated with that particular unit of data bits. For example, each of the input codewords in information $CW_{IN}$ can include 4,096 data bits+X ECC bits (e.g., parity bits), where X is an integer having a value based on the strength (e.g., correction capability) of error correction engine 130.

Information $CW_{OUT}$ can be organized into output codewords. Each of the output codewords can include a combination of data bits from a particular unit (e.g., a page) of data bits (included in data $D_{OUT}$) and ECC bits associated with that particular unit of data bits. For example, each of the output codewords can include 4,096 data bits+X ECC bits. Error correction engine 130 can correct errors (e.g., erroneous bits) in information $CW_{OUT}$ based on ECC bits included in information $CW_{OUT}$. Due to physical properties of memory device 101, errors may occur, and information $CW_{OUT}$ may not be the same as information $CW_{IN}$.

Error correction engine 130 can generate (e.g., calculate) information CWER, which represents an estimate of the rate of codeword (output codeword) errors (e.g., failures) in information $CW_{OUT}$. Thus, as an estimate of codeword errors, this information CWER can be used as a measure for the performance of the LDPC codes used by error correction engine 130. Error correction engine 130 can generate information CWER based on information $CW_{OUT}$ provided to LDPC decoder 134.

Control circuitry 120 can include an error management monitor 140 to monitor the value of information CWER. Based on the value of information CWER, control circuitry 120 can perform memory management operations in order to maintain the reliability of the information stored in memory cells 112. For example, error management monitor 140 may store (or alternatively receive as an input) a pre-determined threshold value (e.g., CWER threshold value). If error management monitor 140 determines (e.g., by comparison) that the value of information CWER generated by error correction engine 130 exceeds (e.g., greater than) the threshold value, then control circuitry 120 can perform memory management operations. Control circuitry 120 may refrain from performing the memory management operations if the value of information CWER does not exceed (e.g., less than or equal to) the threshold value. An example of a memory management operation includes moving (e.g., copying) information from a particular portion in memory 110 (which is associated with information CWER exceeding the threshold value) to another portion (e.g., a new memory block) in memory 110. Moving information can include retrieving information from a particular portion in memory 110 and store the retrieved information in another portion in memory 110. After the information is moved, control circuitry 120 may mark that particular portion in memory 110 as unusable. This means that the particular portion in memory 110 may not be used to store information after the information is moved.

Figure 2:
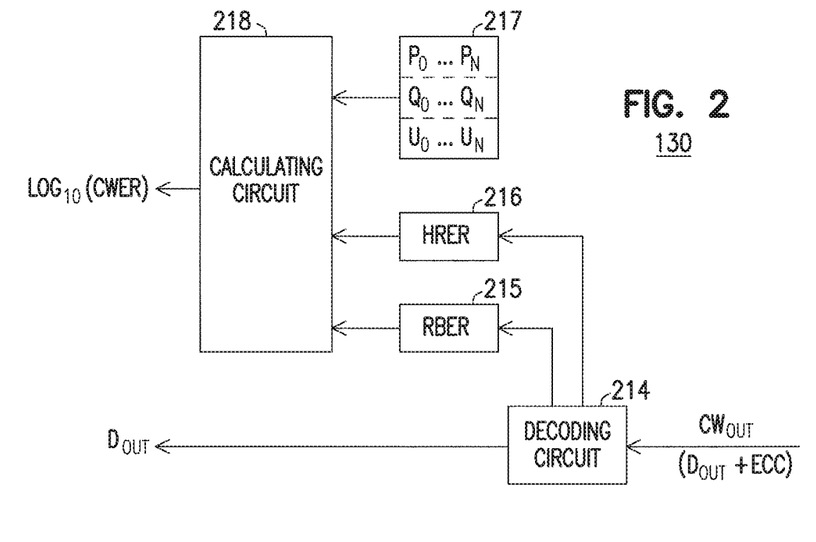
FIG. 2 shows a part of the error correction engine of FIG. 1, according to some embodiments described herein.

FIG. 2 shows a part of error correction engine 130 of FIG. 1, according to some embodiments described herein. As shown in FIG. 2, error correction engine 130 can include a decoding circuit 214, registers 215, 216, and 217, and a calculating circuit 218. Some of the components of error correction engine 130 in FIG. 2 (e.g., decoding circuit 214) can be included in LDPC decoder 134 of FIG. 1.

In FIG. 2, decoding circuit 214 can operate to decode information $CW_{OUT}$ based on LDPC codes (e.g., binary, non-binary, or other classes of LDPC codes) to generate information $D_{OUT}$. Registers 215, 216, and 217 can store information RBER, HBER, and coefficients, respectively. Calculating circuit 218 can use information RBER, HBER, and coefficients as inputs to calculate the value of information CWER, which is the estimated rate of codeword errors in information $CW_{OUT}$, as mentioned above in the description of FIG. 2.

In FIG. 2, the value of information RBER and HRER can be obtained from information $CW_{OUT}$ provided to decoding circuit 214. As described above, information $CW_{OUT}$ can includes bits. Information RBER represents a raw bit error rate, which is the rate of erroneous bits in information $CW_{OUT}$. For example, if information $CW_{OUT}$ provided to decoding circuit 214 has 1000 bits and 150 bits among the 1000 bits are erroneous, then the value of information RBER is 150/1000=0.15. Based on this calculation, over a particular time interval, the value (e.g., average value) of information RBER can be obtained. This value can be stored in register 215 for calculation of information CWER (as described below). FIG. 2 shows an example where information RBER and HRER can be provided by decoding circuit 214. However, information RBER and HRER can be provided (or estimated) by another unit in the system (e.g., flash-based memory system).

Information HRER represents a high reliability error rate, which is the rate of erroneous bits with high reliability value (e.g., high log-likelihood ratio (LLR) value). Each of the bits in information $CW_{OUT}$ provided to decoding circuit 214 can be associated (e.g., assigned) with a reliability (e.g., confidence) level, which can be measured based on log-likelihood ratios. The bits in information $CW_{OUT}$ can be associated with a range of log-likelihood ratios. The reliability level of a bit is proportional to the absolute value of the log-likelihood ratio associated with that bit. Thus, the higher the absolute value of the log-likelihood ratio associated with a bit, the higher the reliability level associated with that bit. The lower the absolute value of the log-likelihood ratio associated with a bit, the lower the reliability level associated with that bit.

One skilled in the art would recognize that a log-likelihood ratio associated with a bit, as described herein, can be considered as a soft value associated with that bit. Such a soft value can be obtained based on measurements of conditional threshold voltage Vt distribution of the memory cells (e.g., memory cells 112) where information $CW_{OUT}$ is retrieved.

In FIG. 2, the value of information HRER can be obtained as follows. Using the same example above, if information $CW_{OUT}$ provided to decoding circuit 214 has 1000 bits and 150 bits among the 1000 bits are erroneous, then the value of information RBER is 150/1000=0.15. In this example, if among the 150 erroneous bits, there are 10 bits with a high reliability level, then the value of information HRER is 10/1000=0.01. Based on this calculation, over a particular time interval, the value (e.g., average value) of information HRER can be obtained. This value can be stored in register 216 for calculation of information CWER.

A high reliability level associated with a bit can be determined as follows. As described above, bits in information $CW_{OUT}$ can be associated with a range of log-likelihood ratios where each of the bits may be associated with a different log-likelihood ratio, depending on the quality of the bit when it is read from the memory cell storing that bit. A bit having a high reliability level can be determined (e.g., pre-determined) to be the bit associated with a log-likelihood ratio (within the range of log-likelihood ratios) that has the highest absolute, an absolute value immediately next to the highest absolute value, or an absolute value within multiple higher absolute values (a group of higher absolute values) among absolute values of LLRs. For example, if the range of the log-likelihood ratios is $-7, -6, -5, \ldots, -1, 0, +1, \ldots, +5, +6, +7$, then a bit with a high reliability level may be determined to be the bit associated with the LLR of $-7$ or $+7$, the LLR of $-6$ or $+6$, the LLR of $-5$ or $+5$, or any of the LLRs of $-7, -6, -5, +5, +6,$ and $+7$ (multiple higher absolute values). Thus, in range of the LLRs, a selected reliability level can be associated with a single higher absolute value in the LLR value range or multiple higher absolute values in the LLR range.

Alternatively, if the values of log-likelihood ratios are unavailable in memory device 101 or if the values of log-likelihood ratios are not used, the value of information RBER can be used to estimate the value of information HRER. For example, the value for information HRER associated with a particular portion (e.g., a memory block) of memory 110 (FIG. 1) can be estimated based the value of information RBER of that particular portion of memory 110 and the number of programming cycles or erase cycles (or both) of that particular portion of memory 110.

As described above, the values of information RBER and HRER can be obtained from information $CW_{OUT}$ retrieved from memory cells 112. Then, values of information RBER and HRER can be stored in registers 215 and 216, respectively. The values of coefficients $P_0$ to $P_N$, $Q_0$ to $Q_N$, and $U_0$ to $U_N$ stored in register 217 can be obtained based on techniques described below with reference to FIG. 3.

In FIG. 2, the values of information RBER and HRER may change based on the value of information $CW_{OUT}$, which in turn is based on the usage, the age, or both of memory 110 (FIG. 1). For example, infrequent use of memory 110 may result in a low number or erroneous bits in information $CW_{OUT}$. This may lead to information RBER, HRER, or both having lower values. In another example, excessive use of memory 110 may result in higher number of erroneous bits. This may lead to information RBER, HRER, or both having higher values. The values of coefficients $P_0$ to $P_N$, $Q_0$ to $Q_N$, and $U_0$ to $U_N$ can remain unchanged (e.g., fixed values) after they are stored in register 217.

Calculating circuit 218 can use information RBER and HRER and the coefficients (e.g., $P_0$ to $P_N$, $Q_0$ to $Q_N$, and $U_0$ to $U_N$) as inputs to calculate the value of information CWER based on formula (1) below.

$$\log_{10}(CWER) = f_M(h) \times r^M + f_{M-1}(h) \times r^{M-1} + \ldots + f_1(h) \times r + f_0(h) \quad (1)$$

In formula (1), $h = \log_{10}(HRER)$, and $r = \log_{10}(RBER)$, and $f_j(h)$ is calculated based on input $h = \log_{10}(HRER)$ and $N+1$ pre-computed coefficients $C^{(j)}_0$ to $C^{(j)}_N$ as follows, where j is from 0 to M.

$$f_j(h) = C^{(j)}_N \times h^N + C^{(j)}_{N-1} \times h^{N-1} + \ldots + C^{(j)}_1 \times h + C^{(j)}_0$$

In formula (1), $\log_{10}(CWER)$ is the value of information CWER. M is a positive integer and $f_M(h), f_{M-1}(h), \ldots, f_0(h)$ are degree-N polynomials. The values of N (the degree of the polynomials) and M can be selected based on configuration and memory structure of memory device 101 (FIG. 1). A practical estimation solution for information CWER with a relatively low error and low complexity can be obtained using M=2 and N=10 (as described below with reference to FIG. 3). In the description herein, some specific values of M and N (e.g., M=2 and N=10) are used only for examples to estimate information CWER. Other values of M and N can be used. The values of M and N can be set according to statistics of the estimation error, selection of computational complexity, or both.

Based on an example of M=2 and N=10, formula (1) can be rewritten as formula (2).

$$\log_{10}(CWER) = f_2(h) \times r^2 + f_1(h) \times r + f_0(h) \quad (2)$$

Each of the degree-N polynomials $f_2(h), f_1(h),$ and $f_0(h)$ in formula (2) can be written as follows (where N=10, as assumed above).

$$f_0(h) = P_{10} \times h^{10} + P_9 \times h^9 + \ldots + P_1 \times h + P_0$$

$$f_1(h) = Q_{10} \times h^{10} + Q_9 \times h^9 + \ldots + Q_1 \times h + Q_0$$

$$f_2(h) = U_{10} \times h^{10} + U_9 \times h^9 + \ldots + U_1 \times h + U_0$$

As shown above, each of the polynomials $f_2(h), f_1(h),$ and $f_0(h)$ has 11 coefficients, such as coefficients $P_0$ to $P_{10}$ in polynomial $f_0(h)$, coefficients $Q_0$ to $Q_{10}$ in polynomial $f_1(h)$, and coefficients $U_0$ to $U_{10}$ in for polynomial $f_2(h)$. Thus, for N=10 in this example, a total of 33 coefficients are used as part of the calculation for the value of $\log_{10}$ (CWER) (which is the value of information CWER)

Figure 3:
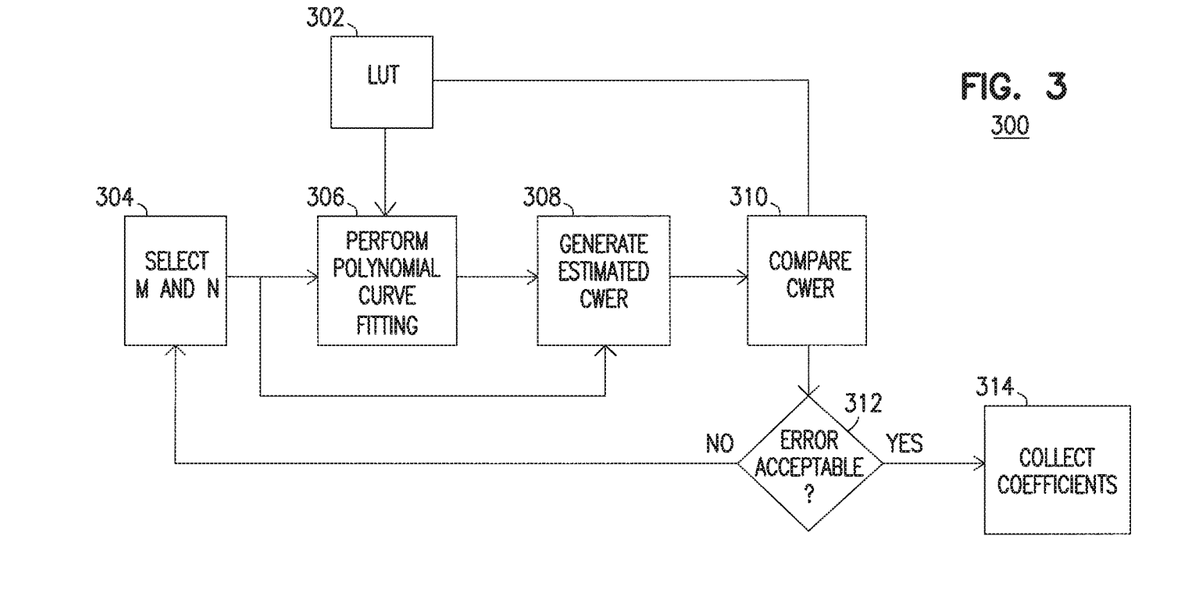
FIG. 3 is a diagram showing an arrangement for obtaining coefficients for polynomials used to calculate the rate of codeword errors of FIG. 2, according to some embodiments described herein.

FIG. 3 is a diagram showing an arrangement 300 for obtaining coefficients for polynomials used to calculate the value of information CWER of FIG. 2, according to some embodiments described herein. The operations associated with arrangement 300 can be performed (e.g., performed off-line) by a computer (e.g., not by memory device 110). As shown in FIG. 3, arrangement 300 includes a LUT 302 that can be constructed from a simulation (e.g., Monte Carlo simulation). LUT 302 can be a two-dimensional (2-D) lookup table that reports simulated output (e.g., values) for information CWER for corresponding values of information HRER and RBER (e.g., HRER, RBER value pair) at different operating points. The accuracy of the simulated output for information CWER in LUT 302 is based on (e.g., proportional to) the number of values (e.g., data points) of information HRER and RBER used in the simulation. This means that the higher number values of HRER and RBER information used in the simulation, the higher accuracy for the value of information CWER in LUT 302 will be achieved.

In FIG. 3, after LUT 302 is obtained (e.g., from a Monte Carlo simulation using values of information HRER and RBER), other operations in arrangement 300 can be performed to obtain coefficients (e.g., $P_0$ to $P_{10}$, $Q_0$ to $Q_{10}$, and $U_0$ to $U_{10}$ in FIG. 2). The obtained coefficients can be subsequently stored in register 217 (FIG. 2) of memory device 101 (FIG. 1) and used for calculating the value of information CWER (FIG. 2).

In FIG. 3, operation 304 can be performed to select initial values for M and N, which are values associated with polynomials $f_M$ (h), $f_{M-1}$ (h) ... $f_0$ (h) described above. Operation 304 can be performed to obtain polynomials $f_M$ (h), $f_{M-1}$ (h) ... $f_0$ (h) based on information from LUT 302. For example, operation 306 may perform a polynomial curve fitting operation to obtain coefficients of polynomials $f_M$(h), $f_{M-1}$ (h) ... $f_0$ (h). Curve fitting operation may include techniques such as interpolation, extrapolation, regression etc.

Operation 308 can be performed to generate estimated information CWER for corresponding HRER and RBER used in the simulation that result in LUT 302. Operation 310 can be performed to compare estimated information CWER (from operation 308) with simulated information CWER (from LUT 302). The comparison may provide a result indicating whether the estimated information CWER has an error relative to the simulated information CWER. It also may provide the difference between estimated information CWER and simulated information CWER as result.

Operation 312 can be performed to determine whether the error value is acceptable (e.g., within an acceptable error range). If the result from operation 312 indicates that the error is acceptable, then operation 314 can be performed to collect (e.g., record) the values of the coefficients of the polynomials that were used to generate the estimated (and acceptable) information CWER (in operation 308). These collected values of the coefficients can be subsequently stored in register 217 (FIG. 2) of memory device 101.

In FIG. 3, if the result from operation 312 indicates that the error is unacceptable (e.g., outside an acceptable range), then operation 314 may not be performed. This means that the values of the coefficients of the polynomials that were used to generate the estimated (unacceptable) information CWER (in operation 308) are not collected (not recorded). In this case, the value of N, M, or both (in operation 304) can be changed (e.g., increasing the value of N). Then, the process (e.g., operations 306, 308, 310, and 312) can continue (e.g., repeat) until the error in the estimated information CWER is acceptable.

Thus, as described above, LUT 302 is used in arrangement 300 as part of operations to obtain (e.g., record) the coefficients of polynomials $f_M$ (h), $f_{M-1}$ (h) ... $f_0$ (h). Then the obtained coefficients can be stored in memory device 101 (e.g., store in register 217 of FIG. 2). The coefficients can be used as part of the calculation of information CWER of FIG. 2.

In arrangement 300, a relatively high number of values (e.g., data points) of information HRER and RBER may be used for the simulation to construct the LUT 302 in order to improve the accuracy of simulated information CWER. Since a higher number of values of HRER and RBER information may be used in the simulation to construct the LUT, the size of LUT 302 can be relatively large. For example, LUT 302 can include 50K to 100K entries or a higher number of entries. Storing and accessing LUT 302 with such a relatively large size in memory device 101 may be impractical. Since LUT 302 can be formulated by the polynomials described above (e.g., $\log_{10}$ (CWER)=$f_2$ (h)× $r^2$+$f_1$ (h)×r+$f_0$ (h)), and the coefficients of the polynomials obtained from LUT 302 can be used to estimate information CWER, LUT 302 can be excluded from (e.g., not stored in) memory device 101. Although LUT 302 is excluded from the memory device 101, information CWER calculated by memory device 101 can still be accurate because higher number of values of HRER and RBER information may be used in the simulation to construct the LUT 302. Further, since LUT 302 is not included in memory device 101, allocating memory to store the LUT 302 and complexity associated with LUT 302 may be avoided.

Figure 4:
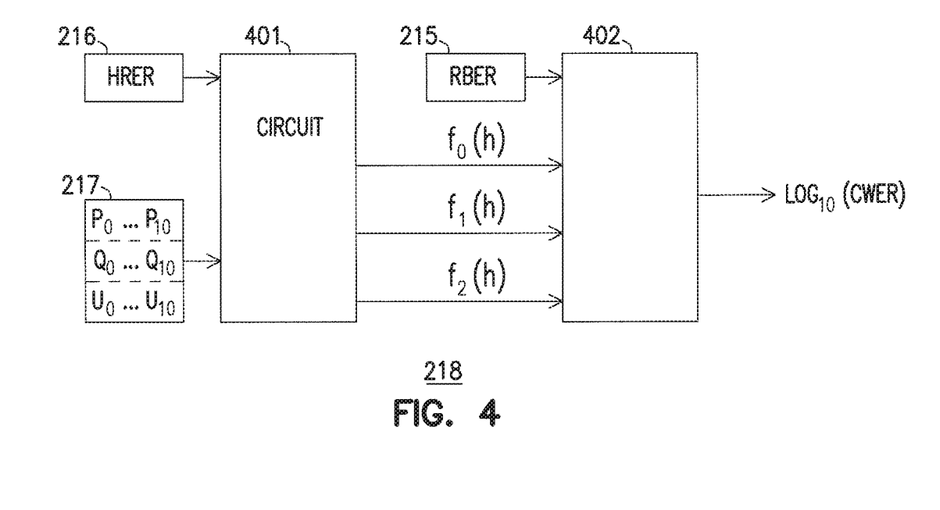
FIG. 4 is block diagram of a calculating circuit of FIG. 2 for calculating a rate of codeword errors, according to some embodiments described herein.

FIG. 4 is block diagram of a calculating circuit 218 of FIG. 2 for calculating information CWER, according to some embodiments described herein. As shown in FIG. 4, calculating circuit 218 includes a combination of circuits 401 and 402. Circuit 401 can receive inputs that include information HRER (in register 216) and coefficients $P_0$ to $P_{10}$, $Q_0$ to $Q_{10}$, and $U_0$ to $U_{10}$ in register 217 (using an example of N=10 and M=2). Circuit 401 can perform mathematic operations (e.g., multiplication and addition operations) on these inputs to calculate the values for polynomials $f_0$ (h), $f_1$ (h), and $f_2$ (h).

Circuit 402 can receive inputs that include RBER (in register 215) polynomials $f_0$ (h), $f_1$ (h), and $f_2$ (h). Circuit 402 can perform mathematic operations (multiplication and addition operations) on these inputs to calculate the values for information CWER (e.g., $\log_{10}$ (CWER)).

Figure 5A:
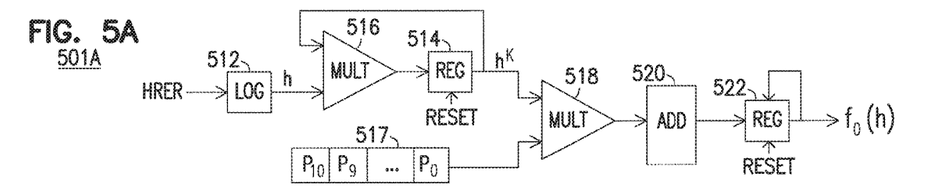

FIG. 5A is block diagram of a circuit 501A for calculating the value for polynomials $f_0$ (h), according to some embodiments described herein. Circuit 501A can be part of calculating circuit 218 of FIG. 2 and FIG. 4. Circuit 501A can operate to calculate the value polynomials $f_0$ (h) based on input information that includes information HRER and coefficients $P_0$ to $P_{10}$.

Information HRER can be obtained based on information $CW_{OUT}$ retrieved from memory cells 112 as described above with reference to FIG. 1. Coefficients $P_0$ to $P_{10}$ (which are stored in a shift register 517) are pre-calculated coefficients that can be obtained from operations of arrangement 300 of FIG. 3. Shift register 517 can be part of register 217 (FIG. 2 and FIG. 4). In FIG. 5A, a converter 512 (e.g., logarithm (LOG) converter) can be used to provide h=$\log_{10}$ (HRER). Register 514 and multiplier 516 can operate to provide $h^k$ where k=0 to N. As assumed above, N=10. Thus, in FIG. 5A, register 514 and multiplier 516 can operate to provide $h^0$ to $h^{10}$. Register 514 can be reset, so that its content can have a value of one at the beginning of the calculation of polynomials $f_0$ (h). Since N is assumed to be 10, it takes N+1 (which is 11 in this example) clock cycles to calculate $f_0$ (h). As described above, $f_0$ (h) includes a sum of products $P_0 \times h^0$, $P_1 \times h^1, \ldots, P_{10} \times h^{10}$ (repeated below).

$$f_0(h)=P_{10} \times h^{10}+P_9 \times h^9+ \ldots +P_1 \times h+P_0$$

In FIG. 5A, in each of the 11 clock cycles (e.g., each of the iterations from 0 to N=10), multiplier 518 can generate a product that includes of one of the coefficients $P_0$ to $P_{10}$ and one of the coefficients $h^0$ to $h^{10}$ (e.g., products $P_0 \times h^0$, $P_1 \times h^1, \ldots, P_{10} \times h^{10}$). Register 522 can be reset such that its content can have a value of zero (e.g., $f_0$ (h)=0) at the beginning of the calculation). After each of products $P_0 \times h^0$, $P_1 \times h^1, \ldots, P_{10} \times h^{10}$ is calculated, adder 520 and register 522 operate to add the products of $P_0 \times h^0$, $P_1 \times h^1, \ldots, P_{10} \times h^{10}$ to calculate $f_0$ (h).

Each of polynomials $f_1$ (h), and $f_2$ (h) can be calculated in ways similar to those used to calculate the value for polynomials $f_0$ (h). However, the coefficients used to calculate the value for polynomials $f_0$ (h), $f_1$ (h), and $f_2$ (h) can be different from one another.

Figure 5B:
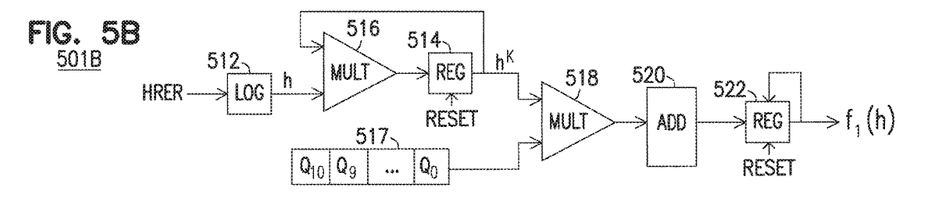

FIG. 5B is block diagram of a circuit 501B for calculating polynomials $f_1$ (h), according to some embodiments described herein. Circuit 501B can be part of calculating circuit 218 of FIG. 2 and FIG. 4. The components of circuit 501B can be similar to, or identical to, the components of circuit 501A of FIG. 5A. Thus, for simplicity, the description and operations of similar or identical components are not repeated. As shown in FIG. 5B, coefficients $Q_0$ to $Q_{10}$ are used in the calculation for polynomials $f_1$ (h). Coefficients $Q_0$ to $Q_{10}$ can be different from coefficients $P_0$ to $P_{10}$. Coefficients $Q_0$ to $Q_{10}$ (which are stored in a shift register 517 of circuit 501B) are pre-calculated coefficients that can be obtained from operations of arrangement 300 of FIG. 3. Similar to circuit 501A of FIG. 5A, circuit 501B of FIG. 5B can perform multiplication and addition operations. These operations can receive input information that includes information HRER and coefficient $Q_0$ to $Q_{10}$ to calculate $f_1$ (h).

Figure 5C:
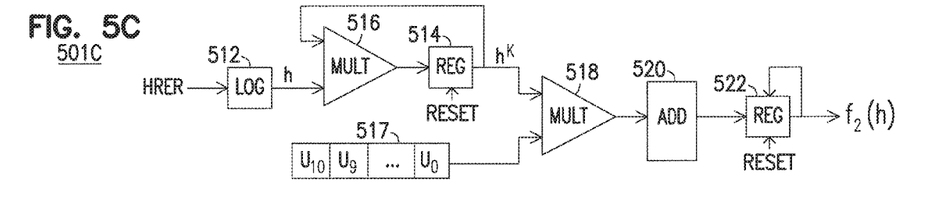

FIG. 5C is block diagram of a circuit 501C for calculating polynomials $f_2$ (h), according to some embodiments described herein. Circuit 501C can be part of calculating circuit 218 of FIG. 2 and FIG. 4. The components of circuit 501C can be similar to, or identical to, the components of circuit 501A of FIG. 5A. Thus, for simplicity, the description and operations of similar or identical components are not repeated. As shown in FIG. 5C, coefficients $U_0$ to $U_{10}$ are used in the calculation for polynomials $f_2$ (h). Coefficients $U_0$ to $U_{10}$ can be different from coefficients $P_0$ to $P_{10}$ and $Q_0$ to $Q_{10}$. Coefficients $U_0$ to $U_{10}$ (which are stored in a shift register 517 of circuit 501C) are pre-calculated coefficients that can be obtained from operations of arrangement 300 of FIG. 3. Similar to circuit 501A of FIG. 5A, circuit 501C of FIG. 5C can perform multiplication and addition operations. These operations can receive input information that includes information HRER and coefficient $U_0$ to $U_{10}$ to calculate $f_2$ (h).

Figure 5D:
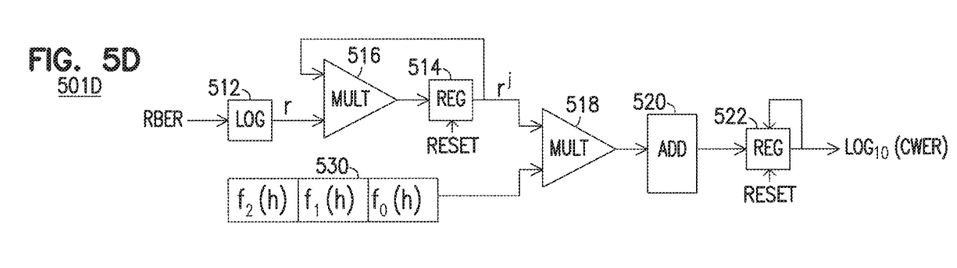

FIG. 5D is block diagram of a circuit 501D for calculating information CWER, according to some embodiments described herein. Circuit 501D can be part of calculating circuit 218 of FIG. 2 and FIG. 4. Circuit 501 can operate to calculate information $\log_{10}$ (CWER) based on input information that includes information RBER and polynomials $f_0$ (h), $f_1$ (h), and $f_2$ (h). Information RBER can be obtained based on information $CW_{OUT}$ retrieved from memory cells 112 as described above with reference 1. Polynomials $f_0$ (h), $f_1$ (h), and $f_2$ (h) (which are stored in a shift register 530) can be calculated by respective circuits 501A, 501B, and 501C, described above with reference to FIG. 5A, FIG. 5B, and FIG. 5C. In FIG. 5D, converter 512 (e.g., logarithm (LOG) converter) can be used to provide r=$\log_{10}$ (RBER). Register 514 and multiplier 516 can operate to provide $r^j$ where j=0 to M. As assumed above, M=2. Thus, in FIG. 5, register 514 and multiplier 516 can operate to provide $r^0$ to $r^2$. Register 514 can be reset, so that its content can have a value of one at the beginning of the calculation of information $\log_{10}$ (CWER). Since M is assumed to be 2, it takes M+1 (which is 3 in this example) clock cycles to calculate information $\log_{10}$ (CWER). As described above, information $\log_{10}$ (CWER) is based on formula below.

$$\text{Log}_{10}(\text{CWER})=f_2(h) \times r^2 + f_1(h) \times r + f_0(h)$$

In FIG. 5D, in each of the 3 clock cycles (e.g., each of the iterations from 0 to M=2), multiplier 518 can generate a product that includes of one of the coefficients $P_0$ to $P_{10}$ and one of the $r^0$ to $r^2$ (e.g., products $f_0$ (h), $f_1$ (h)×r, and $f_2$ (h)×$r^2$). Register 522 can be reset such that its content can have a value of zero (e.g., $\text{Log}_{10}$ (CWER)=0 at the beginning of the calculation). After each of products $f_0$ (h), $f_1$ (h)×r, and $f_2$ (h)×$r^2$ is calculated, adder 520 and register 522 operate to add the products $f_0$ (h), $f_1$ (h)×r, and $f_2$ (h)×$r^2$ to calculate information $\text{Log}_{10}$ (CWER).

The description above gives an example where information $\log_{10}$ (CWER) is calculated by hardware (e.g., circuit 501). However, information $\text{Log}_{10}$ (CWER) can be calculated by any combination of software, firmware, and hardware.

The above description associated with FIG. 5A through FIG. 5D, converter 412 can be used to convert values (e.g., h and r) into log 10 domain, such as to provide h=$\log_{10}$ (HRER), and r=$\log_{10}$ (RBER). However, in an alternative arrangement, instead of using $\log_{10}$ values, actual values (e.g., numerical values) or other converted values (e.g., log 2 domain etc.) of information HRER, RBER, and CWER can be used. Alternatively, a different implementation may be used to calculate information $\text{Log}_{10}$ (CWER). For instance, any combination of floating-point, fixed-point, integer arithmetic can be used to calculate information $\text{Log}_{10}$ (CWER).

Moreover, in FIG. 5A through FIG. 5D, the multiplication and addition operations are performed in a serial fashion to calculate the value for polynomials $f_0$ (h), $f_1$ (h), and $f_2$ (h) (FIG. 5A through 5C) and information $\log_{10}$ (CWER) in FIG. 5D. Alternatively, the multiplication and addition operations in FIG. 5A through FIG. 5D can be performed or implemented differently, for example, they can be performed in a parallel fashion (e.g., performed concurrently) or in a combination of serial and parallel fashion etc.

The description above gives examples where polynomials $f_0$ (h), $f_1$ (h), and $f_2$ (h) are calculated by hardware (e.g., circuits). Alternatively, polynomials $f_0$ (h), $f_1$ (h), and $f_2$ (h) can be calculated by software, firmware, hardware, or any combination of software, firmware, hardware.

The description above gives examples where polynomials $f_0$ (h), $f_1$ (h), and $f_2$ (h) have the same degree (e.g., N=10). However, polynomials $f_0$ (h), $f_1$ (h), and $f_2$ (h) can have different degrees. In an alternative implementation, instead of using polynomial functions, information CWER can be obtained based on piece-wise linear approximation. Moreover, based on statistics of estimation error (for example maximum estimation error), one or more of the following can be applied to the estimated information CWER: guard-bands, correction factor, and correction scalar.

Figure 6:
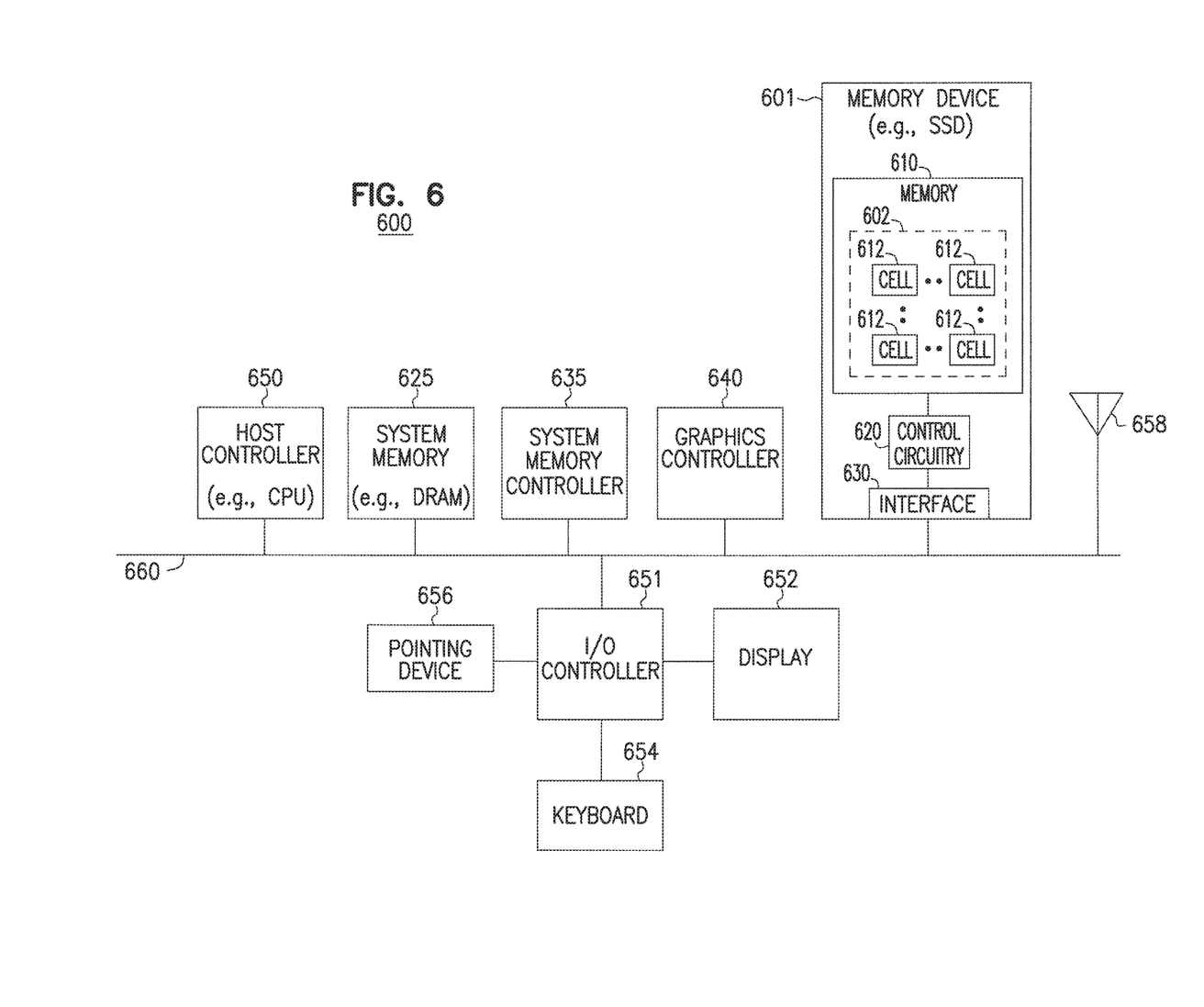
FIG. 6 is a block diagram of an apparatus in the form of a system (e.g., electronic system), according to some embodiments described herein.

FIG. 6 is a block diagram of an apparatus in the form of a system (e.g., electronic system) 600, according to some embodiments described herein. System 600 can include or be included in a computer, a memory storage system, or other types of electronic systems. As shown in FIG. 6, system 600 can include a memory device 601 (which can include a solid state drive (SSD)), a host controller 650, a system memory 625, a system memory controller 635, a graphics controller 640, an input and output (I/O) controller 651, a display 652, a keyboard 654, a pointing device 656, at least one antenna 658, and a bus 660.

As shown in FIG. 6, memory device 601 can include a memory 610, which can include a die 602 where memory cells 612 can be located. Memory device 601 can correspond to memory device 101 of FIG. 1. Thus, memory 610 and memory cells 612 can correspond to memory 110 and memory cells 112, respectively, of FIG. 1. FIG. 6 shows one die 602 in memory 610 as an example. Memory 610 can include multiple dice where memory cells 112 can be located in the multiple dice.

Memory device 601 can include a control unit 620 and an interface 630 coupled to bus 660. Interface 630 can include components (e.g., connectors and circuitry) that comply with the Peripheral Component Interconnect Express (PCIe) specification, Serial Advanced Technology Attachment (SATA) specification, Serial Attached Small Computer System Interface (SAS) specification, InfiniB and specification, Ethernet specification, Fibre Channel specification, or other specifications. Thus, interface 630 may include a connector having a form factor (e.g., physical dimension and conductive terminals) complying with PCIe, SATA, SAS, Infini-Band, Ethernet (e.g., 10G/40G/100G Ethernet), Fibre Channel, or other specifications.

Control unit 620 of memory device 601 can be included in a die separate from die 602 of memory 610. Memory device 601 can be configured to operate in ways similar to, or the same as, memory device 101 of FIG. 1.

Host controller 650 may include a CPU, which can be part of a general-purpose processor or part of an application specific integrated circuit (ASIC). System memory 625 may include a dynamic random-access memory (DRAM) device, a static random-access memory (SRAM) device, a flash memory device, or a combination of these memory devices. I/O controller 651 can include a communication module for wired or wireless communication (e.g., communication through one or more antennas 658). Display 652 can include a liquid crystal display (LCD), a touchscreen (e.g., capacitive or resistive touchscreen), or another type of display. Pointing device 656 can include a mouse, a stylus, or another type of pointing device.

FIG. 6 shows the components of system 600 arranged separate from each other as an example. In some arrangements, two or more components of system 600 can be located on the same die (e.g., same integrated circuit chip).

Figure 7:
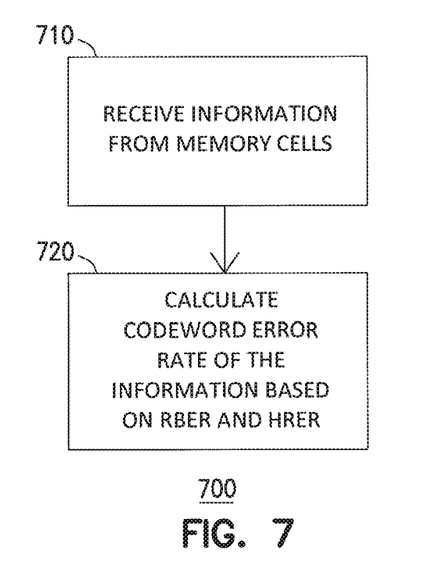
FIG. 7 is a flow diagram showing a method of generating a rate of codeword errors in a memory device, according to some embodiments described herein.

FIG. 7 is a flow diagram showing a method 700 of generating (e.g., estimating) information CWER in a memory device, according to some embodiments described herein. Method 700 can be performed by a memory device (memory device 101 or memory device 601) described above with reference to FIG. 1 through FIG. 6. Some or all of the activities in method 700 can be implemented by software, firmware, hardware, or any combination of software, firmware, and hardware.

As shown in FIG. 7, method 700 can include activities 710 and 720. Activity 710 can include receiving information from memory cells of the memory device. The information can include codewords. The codewords can include data bits and LDPC parity bits. Activity 720 can include calculating a rate of codeword errors in the codewords of the information. The calculation can be based on a rate of erroneous bits in the information (e.g., RBER) and a rate of erroneous bits in the information with a selected reliability level (e.g., HRER). The erroneous bits with the selected reliability level are a portion of the erroneous bits in the information. Method 700 can include additional activities described above with reference to FIG. 1 through FIG. 6, such as activities and operations of memory device 101 and system 600 and other operations associated with the components (e.g., circuits) FIG. 2 through FIG. 6.

The illustrations of the apparatuses (e.g., memory device 101 and system 600) and methods (e.g., method 700 and operations performed by memory device 101 and system 600) are intended to provide a general understanding of the structure of various embodiments and are not intended to provide a complete description of all the elements and features of an apparatus that might make use of the structures described herein.

The apparatuses (e.g., memory device 101 and system 600) described above can include or be included in high-speed computers, communication and signal processing circuitry, single- or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7 include apparatuses and methods using a low-density parity-check (LDPC) decoding circuit to receive information retrieved from memory cells, the information including codewords, and a calculating circuit to calculate a rate of codeword errors in the codewords. The calculation is based on a rate of erroneous bits in the information and a rate of erroneous bits with a selected reliability level. The erroneous bits with the selected reliability level form a portion of the erroneous bits in the information. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
   a low-density parity-check (LDPC) decoding circuit to receive information retrieved from memory cells, the information including codewords;
   a calculating circuit to calculate a rate of codeword errors in the codewords based on a rate of erroneous bits in the information and a rate of erroneous bits with a selected reliability level, the erroneous bits with the selected reliability level being a portion of the erroneous bits in the information, wherein the selected reliability level is based on one of log-likelihood ratios associated with the erroneous bits; and at least one hardware processor to perform a memory management operation if the rate of codeword errors equals or exceeds a value, and the at least one hardware processor to refrain from performing the memory management operation if the rate of codeword errors does not exceed the value, wherein the at least one hardware processor includes a monitor to initiate the memory management operation based on the rate of codeword errors, and the memory management operation includes retrieving information stored in a portion of the memory cells and storing the information in another portion of the memory cells.

2. The apparatus of claim 1, wherein the selected reliability level is associated with a selected log-likelihood ratio value among log-likelihood ratios associated with the erroneous bits in the information, and the selected log-likelihood ratios has an absolute value higher than at least one absolute value among absolute values of the log-likelihood ratios.

3. The apparatus of claim 1, wherein the calculating circuit is configured to perform multiplication and addition operations to calculate the rate of codeword errors.

4. An apparatus comprising:
a register to store coefficients of polynomials;
a first circuit to calculate values of the polynomials based on values of the coefficients and a rate of erroneous bits with a selected reliability level among reliability levels associated with erroneous bits in the information retrieved from memory cells, the erroneous bits with the selected reliability level being included in the erroneous bits in the information retrieved from the memory cells;
a second circuit to calculate a rate of codeword errors in the information retrieved from memory cells based on the values of the polynomials and a rate of erroneous bits in the information retrieved from the memory cells, wherein the reliability levels associated with the erroneous bits are based on log-likelihood ratios associated with the erroneous; and
at least one hardware processor to perform a memory management operation if the rate of codeword errors exceeds a value, and the at least one hardware processor to refrain from performing the memory management operation if the rate of codeword errors does not exceed the value, wherein the at least one hardware processor includes a monitor to initiate the memory management operation based on the rate of codeword errors, and the memory management operation includes retrieving information stored in a portion of the memory cells and storing the information in another portion of the memory cells.

5. The apparatus of claim 4, wherein the first circuit is configured to perform multiplication and addition operations on values of the coefficients and the rate of erroneous bits with the selected reliability level to calculate the values of the polynomials.

6. The apparatus of claim 4, wherein the second circuit is configured to perform multiplication and addition operations on values of the polynomials and the rate of erroneous bits in the information retrieved from the memory cells to calculate the rate of codeword errors.

7. The apparatus of claim 4, wherein the log-likelihood ratios include a first absolute value and a second absolute value, the first absolute value is greater than the second absolute value, and the selected reliability level corresponds to the first absolute value.

8. The apparatus of claim 7, wherein each of the rate of erroneous bits with the selected reliability level and the rate of erroneous bits in the information retrieved from the memory cells is represented in a numerical domain.

9. The apparatus of claim 8, wherein each of the rate of erroneous bits with the selected reliability level and the rate of erroneous bits in the information retrieved from the memory cells is represented in a logarithmic domain.

10. The apparatus of claim 4, wherein the information includes codewords, the codewords include data encoded with a low-density parity-check (LDPC) code.

11. An apparatus comprising:
non-volatile memory cells; and
at least one hardware processor coupled to the memory cells, the at least one hardware processor including:
a low-density parity-check (LDPC) decoding circuit to receive information retrieved from the non-volatile memory cells, the information including codewords; and
a calculating circuit to calculate a rate of codeword errors in the codewords based on a rate of erroneous bits in the information and a rate of erroneous bits with a selected reliability level, the erroneous bits with the selected reliability level being a portion of the erroneous bits in the information, wherein the selected reliability level is based on one of log-likelihood ratios associated with the erroneous bits, the at least one hardware processor is to perform a memory management operation if the rate of codeword errors exceeds a value, the at least one hardware processor is to refrain from performing the memory management operation if the rate of codeword errors does not exceed the value, the at least one hardware processor includes a monitor to initiate the memory management operation based on the rate of codeword errors, and the memory management operation includes retrieving information stored in a portion of the memory cells and storing the information in another portion of the memory cells.

12. The apparatus of claim 11, wherein the at least one hardware processor is included in a die, and the non-volatile memory cells are included in at least one additional die.

13. An apparatus comprising:
a processor; and
a solid state drive coupled to the processor, the solid stare drive including:
non-volatile memory cells; and
at least one hardware processor coupled to the memory cells, the at least one hardware processor including a low-density parity-check (LDPC) decoding circuit to receive information retrieved from memory cells, the information including codewords, and a calculating circuit to calculate a rate of codeword errors in the codewords based on a rate of erroneous bits in the information and a rate of erroneous bits with a selected reliability level, the erroneous bits with the selected reliability level being a portion of the erroneous bits in the information, wherein the selected reliability level is one of reliability levels associated with the erroneous bits, the at least one hardware processor is to perform a memory management operation if the rate of codeword errors exceeds a value, the at least one hardware processor is to refrain from performing the memory management operation if the rate of codeword errors does not exceed the value, the at least one hardware processor includes a monitor to initiate the memory management operation based on the rate of codeword errors, and the memory management operation includes retrieving information stored in a portion of the memory cells and storing the information in another portion of the memory cells.

14. The apparatus of claim 13, wherein each of the erroneous bits in the information is associated with a log-likelihood ratio within a range of log-likelihood ratios associated with the erroneous bits, and the selected reliability level is associated with one of the log-likelihood ratios.

15. The apparatus of claim 13, wherein the solid state drive includes a connector coupled to the processor, the connector having a form factor complying with one of Peripheral Component Interconnect Express (PCIe) specification, Serial Advanced Technology Attachment (SATA) specification, Serial Attached Small Computer System Interface (SAS) specification, InfiniBand specification, Ethernet specification, Fibre Channel specification.

16. A method comprising:
receiving information from memory cells, the information including codewords, the codewords including data bits and low-density parity-check (LDPC) parity bits;
calculating a rate of codeword errors in the codewords based on a rate of erroneous bits in the information and a rate of erroneous bits in the information with a selected reliability level, the erroneous bits with the selected reliability level being a portion of the erroneous hits in the information, wherein the selected reliability level is based on one of log-likelihood ratios associated with the erroneous bits;
performing a memory management operation if the rate of codeword errors exceeds a value;
refraining from performing the memory management operation if the rate of codeword errors does not exceed the value;
initiating the memory management operation based on the rate of codeword errors, and
retrieving information stored in a portion of the memory cells and storing the information in another portion of the memory cells.

17. The method of claim 16, wherein calculating the rate of codeword errors includes:
calculating values for polynomials based on values of coefficients and the rate of erroneous bits with the selected reliability level among reliability levels associated with the erroneous bits in the information retrieved from memory cells, the erroneous bits with the selected reliability level are included in the erroneous bits in the information retrieved from memory cells; and
calculating the rate of codeword errors based on the values of the polynomials and the rate of erroneous bits in the information.

18. The method of claim 16, wherein the rate of erroneous bits in the information is an average rate of erroneous bits in the information, and the rate of erroneous bits in the information with the selected reliability level is an average rate of erroneous bits with the selected reliability level.

19. The method of claim 16, wherein the selected reliability level is associated with a log-likelihood ratio value among log-likelihood ratios associated with the erroneous bits in the information, and the log-likelihood ratio has the highest absolute value among absolute values of the log-likelihood ratios.

\* \* \* \* \*